United States Patent
Nonin

(10) Patent No.: US 8,380,149 B2
(45) Date of Patent: Feb. 19, 2013

(54) DC OFFSET CANCELLER, RECEIVING APPARATUS AND DC OFFSET CANCELLATION METHOD

(75) Inventor: Katsuya Nonin, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 226 days.

(21) Appl. No.: 12/881,378

(22) Filed: Sep. 14, 2010

(65) Prior Publication Data

US 2011/0215857 A1    Sep. 8, 2011

(30) Foreign Application Priority Data

Mar. 4, 2010   (JP) .................................. 2010-47854

(51) Int. Cl.
 *H04B 1/04* (2006.01)
(52) U.S. Cl. ........ 455/130; 455/131; 455/136; 455/137; 455/138; 455/140; 375/316; 375/317; 375/319
(58) Field of Classification Search .................. 455/130, 455/131, 136, 137, 140, 138, 207, 209, 213, 455/219, 232.1, 234.1, 245.1, 251.1, 306, 455/307, 341; 375/316, 317, 319, 345
See application file for complete search history.

(56) References Cited

U.S. PATENT DOCUMENTS

2004/0102908 A1* 5/2004 Larson et al. ................... 702/45
2007/0237264 A1* 10/2007 Huang et al. .................. 375/332

FOREIGN PATENT DOCUMENTS

JP    2006-108844    4/2006

* cited by examiner

*Primary Examiner* — Tuan Pham
(74) *Attorney, Agent, or Firm* — Turocy & Watson, LLP

(57) ABSTRACT

According to an embodiment, a DC offset canceller includes a first DA converter, a first adder, an amplifier, a comparator, an averaging circuit, and a successive approximation register. The first DA converter is configured to DA-convert first correction data into a first correction voltage. The first adder is configured to add an input signal and the first correction voltage to output a first added signal. The amplifier is configured to amplify the first added signal to output an amplified signal. The comparator is configured to compare the amplified signal and a reference voltage to output a comparison result. The averaging circuit is configured to receive the comparison results of the comparator to obtain a majority decision result by performing majority decision on logical values of the comparison results in a predetermined time period. The successive approximation register is configured to sequentially set each bit of the first correction data based on the majority decision result so that a DC offset in the amplified signal decreases.

18 Claims, 12 Drawing Sheets

| DAC CONTROL CODE | DAC OUTPUT VOLTAGE |
|---|---|
| 00000 | −16mV |
| 00001 | −15mV |
| 00010 | −14mV |
| ⋮ | ⋮ |
| 01111 | −1mV |
| 10000 | 0mV |
| 10001 | 1mV |
| ⋮ | ⋮ |
| 11101 | 13mV |
| 11110 | 14mV |
| 11111 | 15mV |

FIG. 4

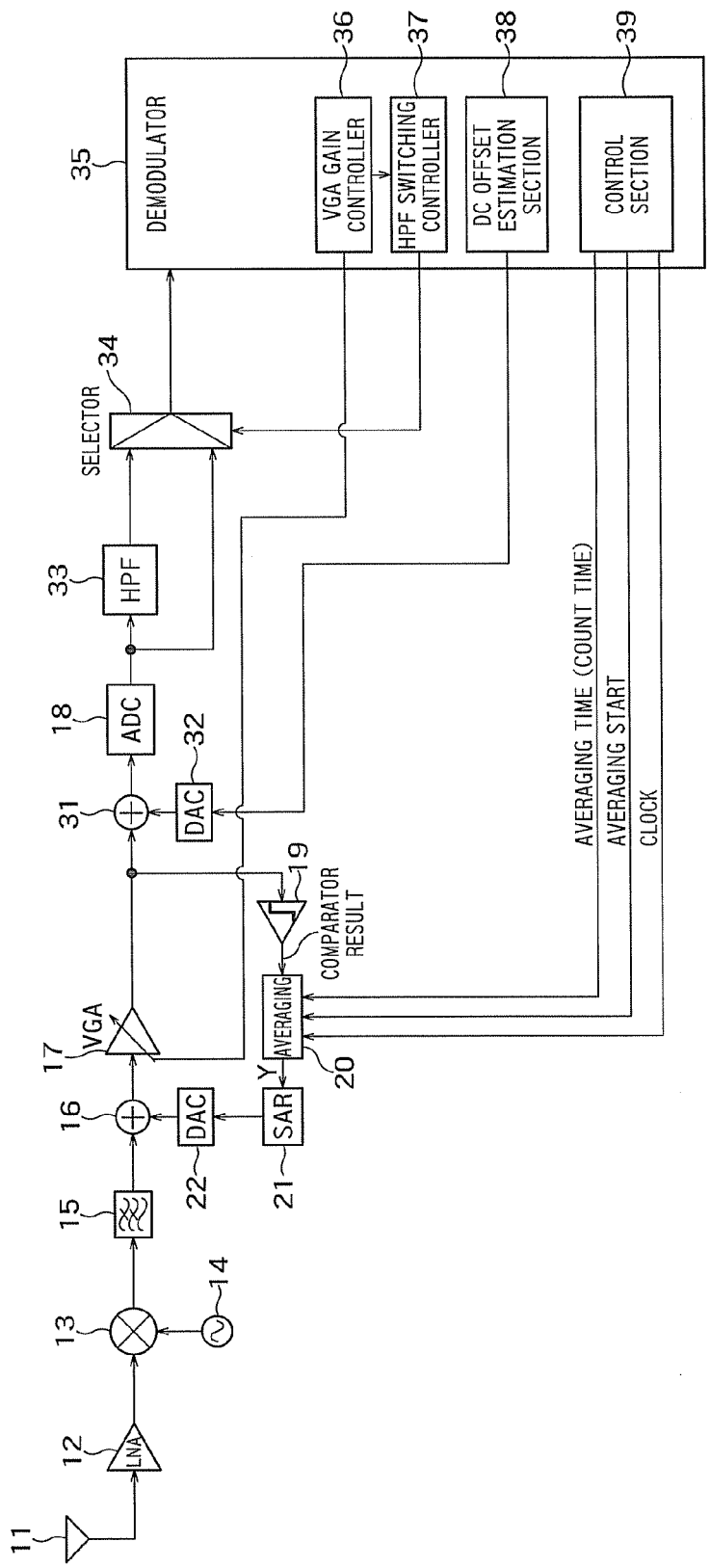
F I G. 5

US 8,380,149 B2

DC OFFSET CANCELLER, RECEIVING APPARATUS AND DC OFFSET CANCELLATION METHOD

CROSS REFERENCE TO RELATED APPLICATIONS

This application is based upon and claims the benefit of priority from the prior Japanese Patent Application No 2010-47854 filed on Mar. 4, 2010, the entire contents of which are incorporated herein by reference.

FIELD

Embodiments described herein relate generally to a DC offset canceller, a receiving apparatus and a DC offset cancellation method.

BACKGROUND

A conventional DC (direct current) offset canceller, which uses an SAR (Successive Approximation Register) and is used for wireless communication, determines whether an output of VGA (Variable Gain Amplifier) is greater than or smaller than 0 by a comparator, and performs DC offset cancellation with an SAR algorithm by using the determination result.

In the conventional method, when the gain of LNA (Low Noise Amplifier) and the VGA is low, the output signal of the VGA (that is, input signal to the comparator) is not affected by noise input into the LNA, and the DC offset cancellation is performed correctly. However, when the gain of the LNA and the VGA is high, the noise input into the LNA is amplified and the output signal of the VGA fluctuates largely in both positive and negative directions, so that the influence of the noise cannot be ignored. For example, if a result of comparator is used at a timing when the output signal of the VGA fluctuates in the positive direction, a DC offset value is erroneously calculated to be positive by the algorithm of SAR even though the actual DC offset value is negative. As a result, there is a problem that the DC offset canceller does not operate correctly and the DC offset is not cancelled.

For example, a DC offset canceller described in Japanese Patent Application Laid-Open No. 2006-108844 is known.

BRIEF DESCRIPTION OF THE DRAWINGS

FIG. 4 is a table showing a correspondence relationship between the DAC code and the output voltage of the DAC according to the first embodiment of the present invention.

FIG. 5 is a block diagram of a receiving apparatus including a DC offset canceller according to a second embodiment of the present invention.

DETAILED DESCRIPTION

According to an embodiment, a DC offset canceller includes a first DA converter, a first adder, an amplifier, a comparator, an averaging circuit, and a successive approximation register. The first DA converter is configured to DA-convert first correction data into a first correction voltage. The first adder is configured to add an input signal and the first correction voltage to output a first added signal. The amplifier is configured to amplify the first added signal to output an amplified signal. The comparator is configured to compare the amplified signal and a reference voltage to output a comparison result. The averaging circuit is configured to receive the comparison results of the comparator to obtain a majority decision result by performing majority decision on logical values of the comparison results in a predetermined time period. The successive approximation register is configured to sequentially set each bit of the first correction data based on the majority decision result so that a DC offset in the amplified signal decreases.

Prior to the description of embodiments of the present invention, a comparative example of a DC offset canceller that the inventor knows about will be described.

Figure 9:
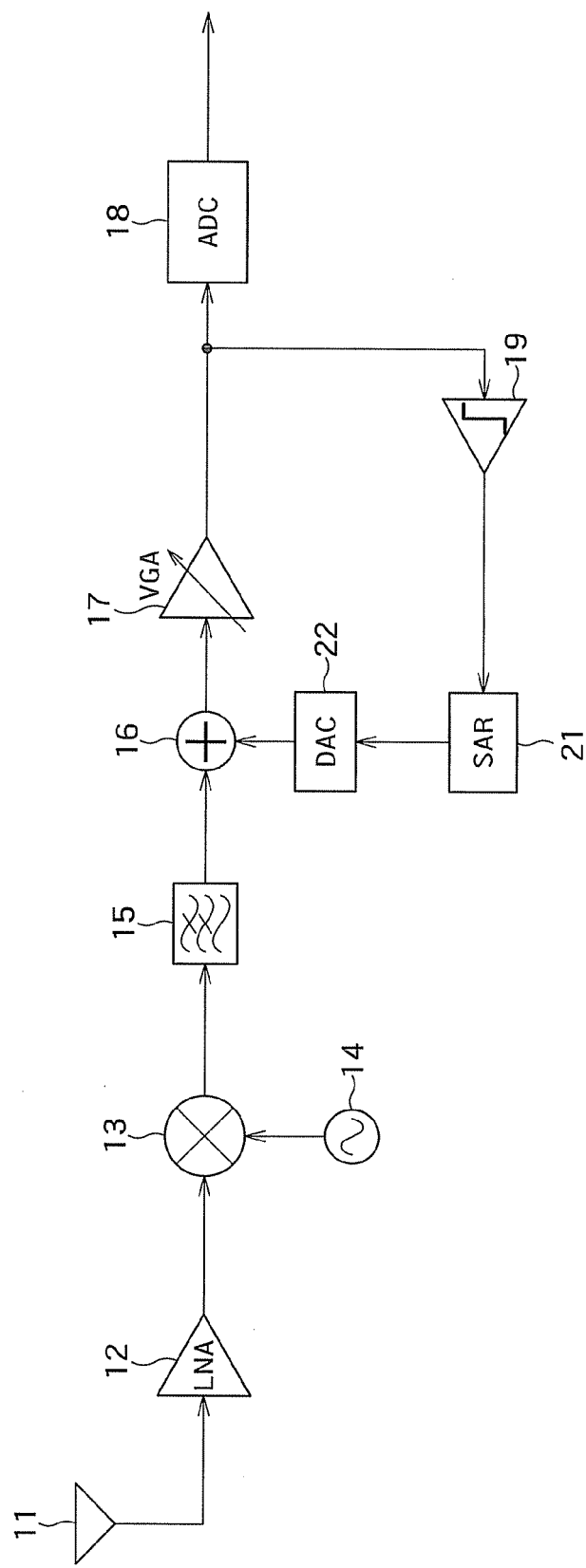
FIG. 9 is a block diagram of a receiving apparatus including a DC offset canceller according to the comparative example.

FIG. 9 is a block diagram of a receiving apparatus including a DC offset canceller according to the comparative example.

As shown in FIG. 9, the receiving apparatus includes an antenna 11, an LNA 12, a mixer 13, an oscillator 14, a low pass filter 15, an adder 16, a VGA 17, an AD converter (hereinafter referred to as ADC) 18, a comparator 19, an SAR 21, and a DA converter (hereinafter referred to as DAC) 22.

A part related to DC offset cancellation will be mainly described. The adder 16 adds an output signal of the low pass filter 15 and a correction voltage from the DAC 22, and outputs the addition result to the VGA 17. The VGA 17 amplifies the output signal of the adder 16 by a predetermined gain. The output signal of the VGA 17 is input into the comparator 19. The comparator 19 compares the output signal of the VGA 17 and a reference signal (ground potential). When the output signal of the VGA 17 is positive, the comparator 19 outputs a comparison result "1", and when the output signal of the VGA 17 is negative, the comparator 19 outputs a comparison result "0". The SAR 21 sequentially sets each bit of a DAC code in order from the MSB, according to the comparison result "1" or "0" input from the comparator 19, so that a DC offset of the output signal of the VGA 17 decreases. The DAC 22 DA-converts the DAC code set by the SAR 21 and outputs the correction voltage to the adder 16. The DC offset of the output signal of the VGA 17 is cancelled by the correction voltage.

Hereinafter, an operation of the SAR 21 will be described.

Figure 10:
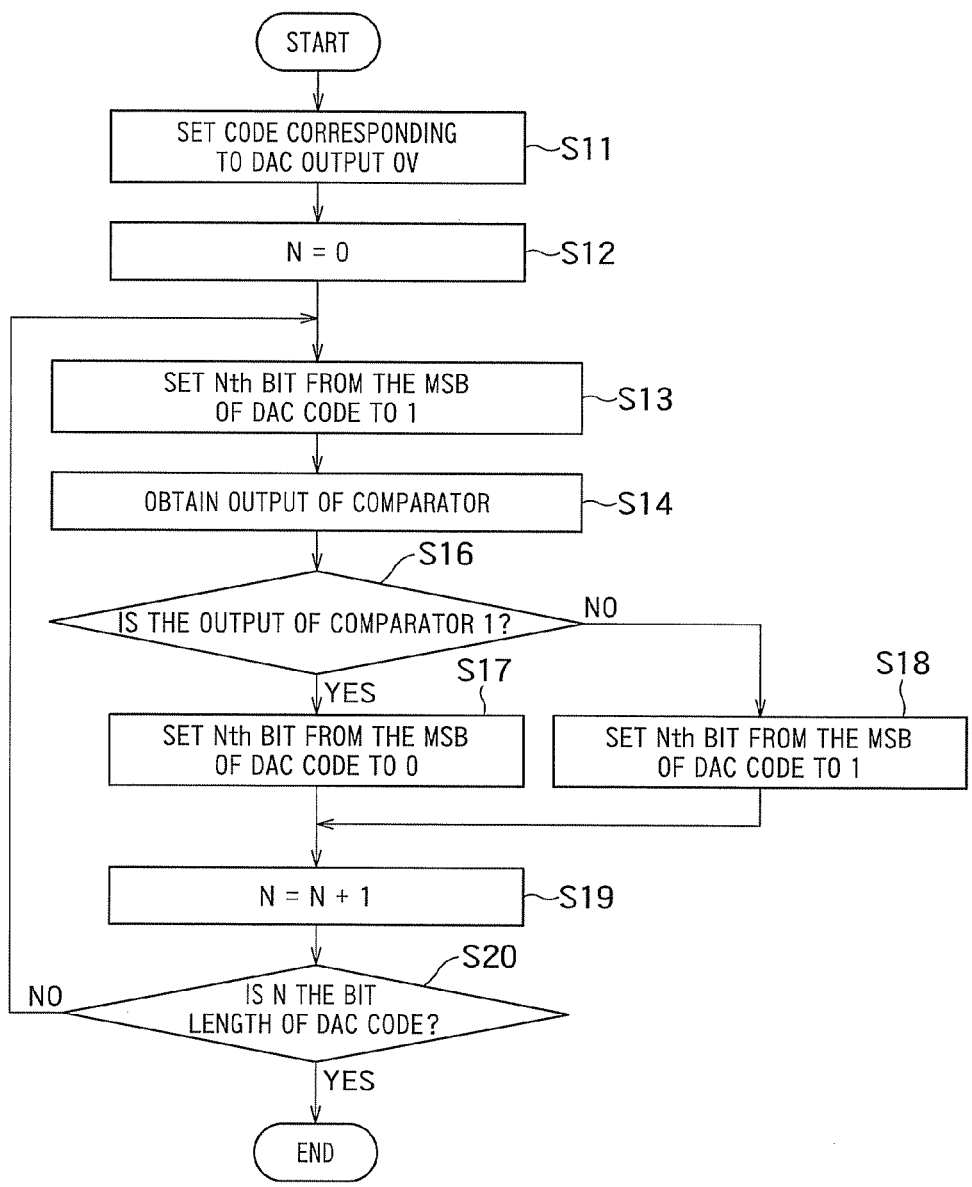
FIG. 10 is a flowchart showing an algorithm of the SAR according to the comparative example.

FIG. 10 is a flowchart showing an algorithm of the SAR according to the comparative example.

First, a DAC code corresponding to an output voltage 0 V of the DAC 22 is set (step S11).

Next, a variable N=0 is set (step S12).

Next, the Nth bit from the MSB of the DAC code is set to "1" (step S13).

Next, the output (comparison result) of the comparator 19 is obtained (step S14).

Next, if the output of the comparator 19 is "1" (step S16: Yes), the Nth bit from the MSB of the DAC code is set to "0" (step S17). If the output of the comparator 19 is "0" (step S16: No), the Nth bit from the MSB of the DAC code is set to "1" (step S18).

Next, the variable N=N+1 is set (step S19).

Next, when the variable N is the bit length of the DAC code (step S20: Yes), the process ends. When the variable N is not the bit length of the DAC code (step S20: No), the process returns to step S13.

In this way, the SAR 21 controls the DC offset so that the DC offset approaches 0.

Figure 11:
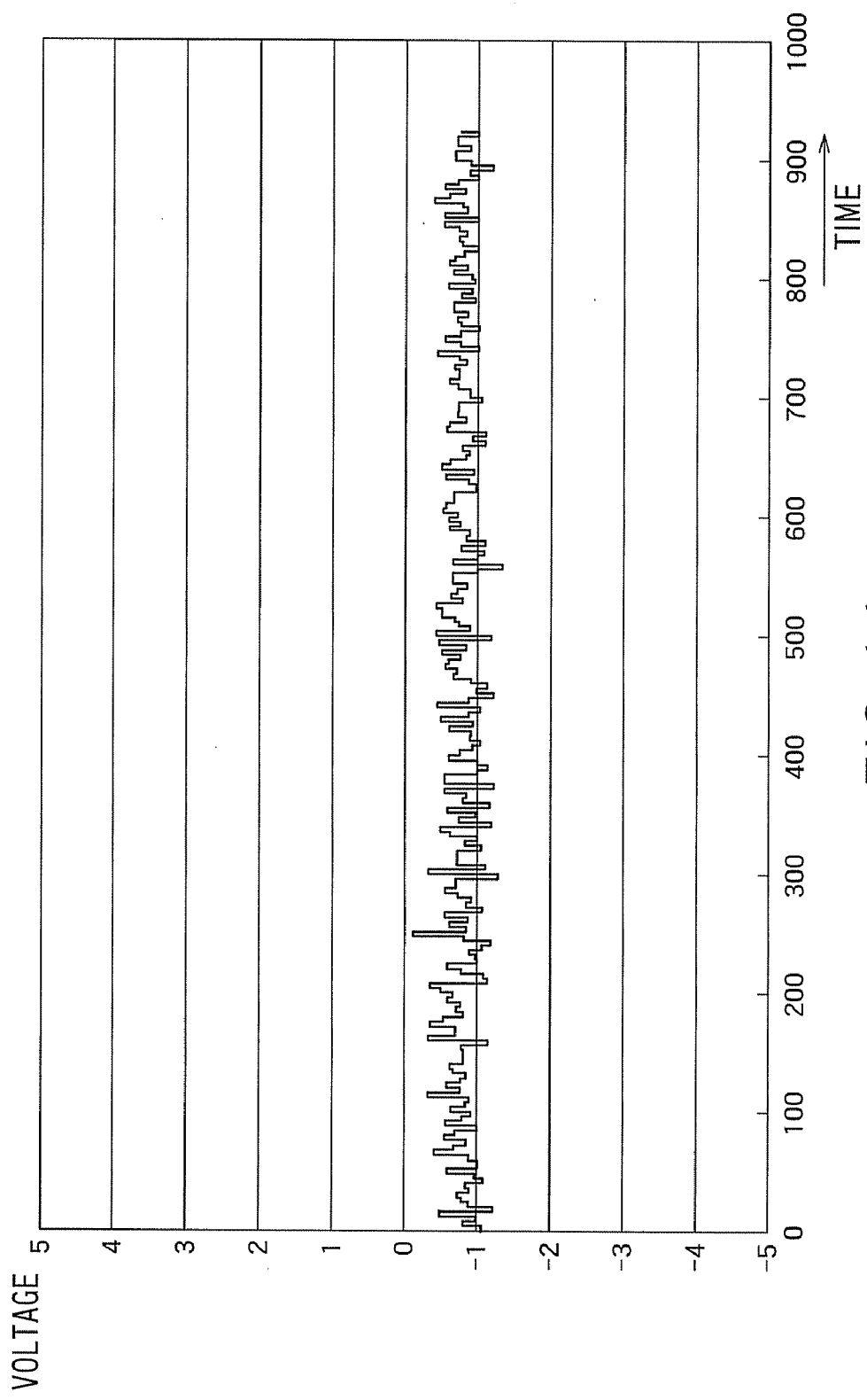
FIG. 11 is a waveform chart of the output signal of the VGA, when the gains of the LNA and the VGA are low, according to the comparative example.

FIG. 11 is a waveform chart of the output signal of the VGA, when the gains of the LNA and the VGA are low, according to the comparative example.

The vertical axis of FIG. 11 indicates voltage in any unit of measurement, and the horizontal axis indicates time in any unit of measurement. As shown in FIG. 11, the output signal of the VGA in this case maintains a negative value, so that it is known that the output signal of the VGA has a negative offset.

Figure 12:
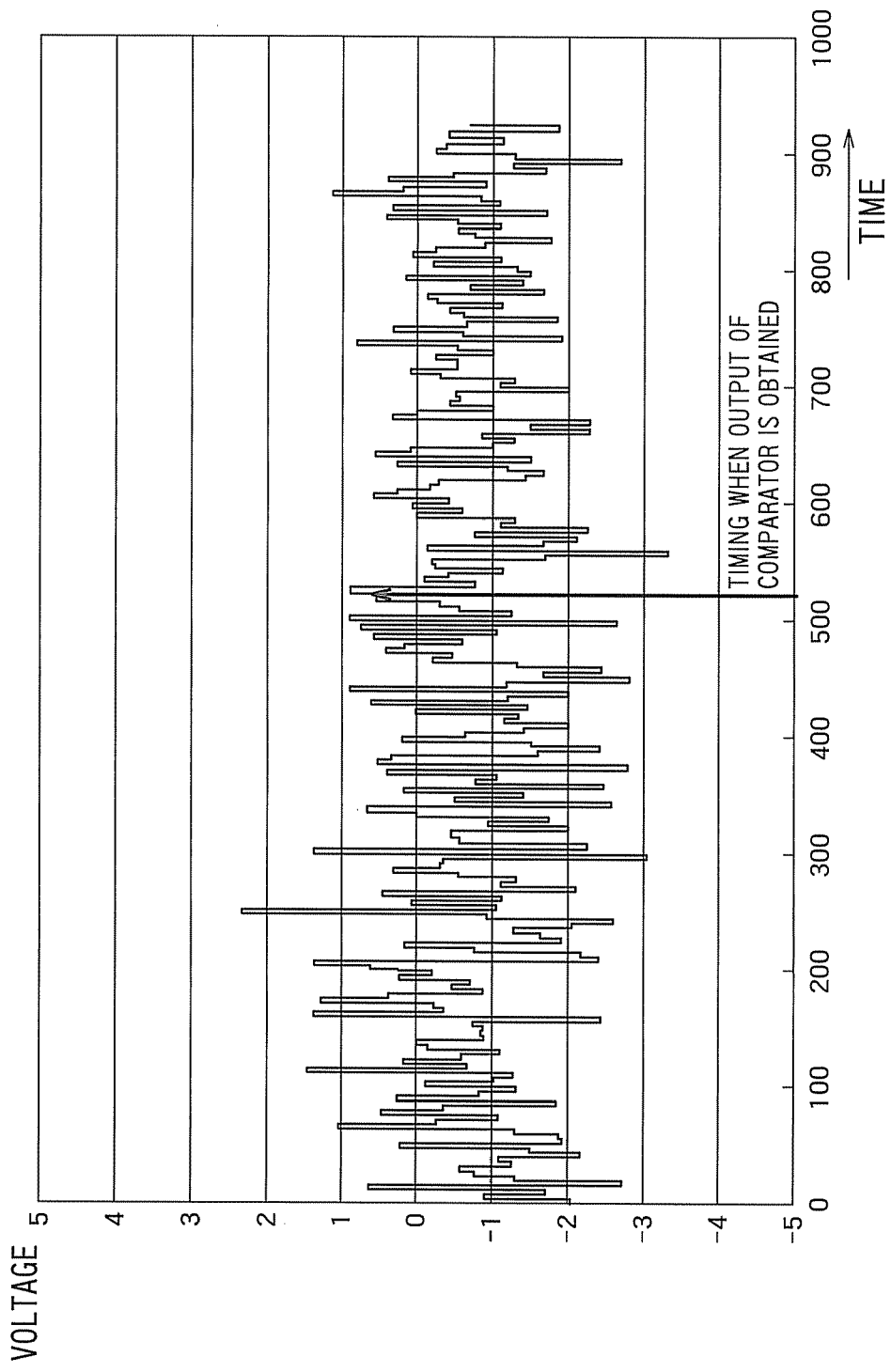
FIG. 12 is a waveform chart of the output signal of the VGA, when the gains of the LNA and the VGA are high, according to the comparative example.

FIG. 12 is a waveform chart of the output signal of the VGA, when the gains of the LNA and the VGA are high, according to the comparative example.

As shown in FIG. 12, although the output signal of the VGA in this case also has a negative offset, the noise is amplified and the signal fluctuates largely between positive and negative values. Therefore, the output signal of the VGA has a positive voltage at the timing indicated by an arrow in FIG. 12. In other words, at this timing, the output of the comparator 19 indicates a false value. Therefore, a false DAC code is set in step S17, S18 of FIG. 10, and thus the DC offset cancellation is not performed correctly.

Although the SAR 21 has a small circuit scale and operates in high speed, the SAR 21 has a characteristic of being susceptible to noise at high gain, as described above.

Hereinafter, embodiments of the present invention will be described with reference to the drawings. The embodiments do not limit the present invention.

The embodiments described below can be applied to, for example, a receiving apparatus that receives a burst signal of a TDMA (Time Division Multiple Access) method compliant with the WiMAX (Worldwide Interoperability for Microwave Access) standard or the like.

(First Embodiment)

In this embodiment, comparison results of a comparator are averaged and averaged results are input into an SAR.

Figure 1:
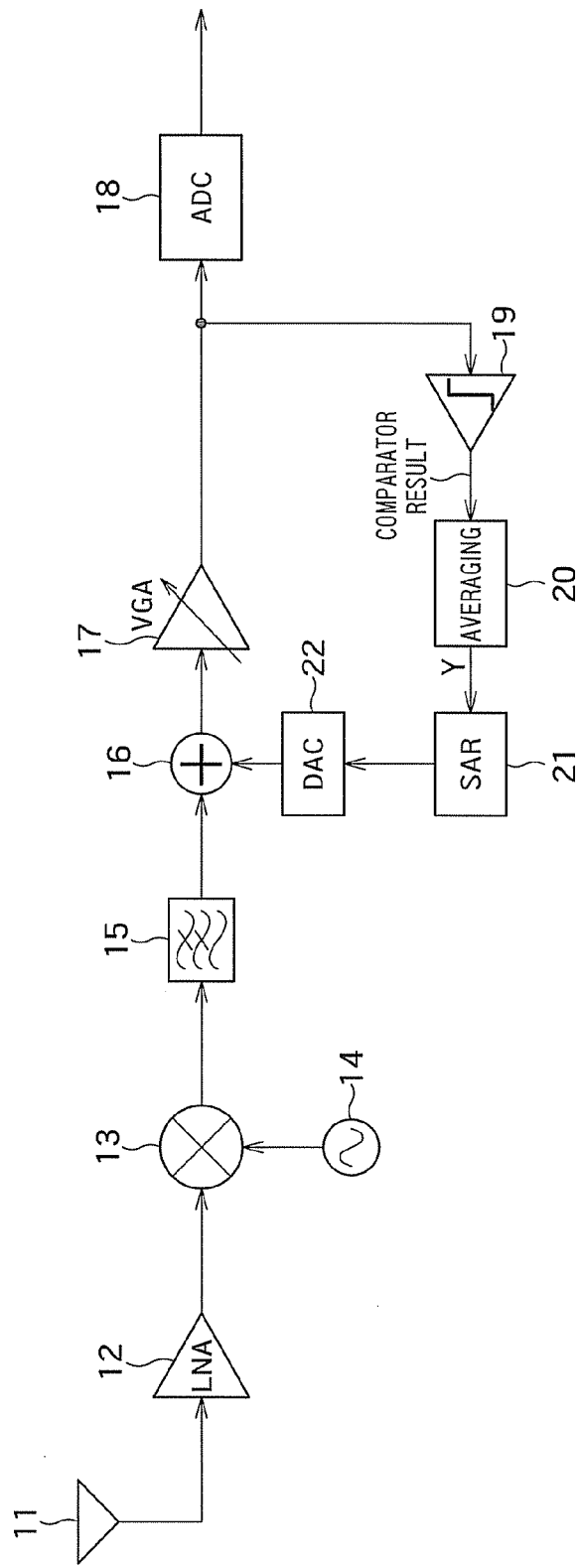
FIG. 1 is a block diagram of a receiving apparatus including a DC offset canceller according to a first embodiment of the present invention.

FIG. 1 is a block diagram of a receiving apparatus including a DC offset canceller according to a first embodiment of the present invention.

As shown in FIG. 1, the receiving apparatus includes an antenna 11, an LNA 12, a mixer 13, an oscillator 14, a low pass filter 15, an adder (first adder) 16, a VGA 17, an AD converter 18, a comparator 19, an averaging circuit 20, an SAR 21, and a DA converter (first DA converter) 22. The adder 16, the VGA 17, the comparator 19, the averaging circuit 20, the SAR 21, and the DAC 22 function as the DC offset canceller. The same constituent elements as those in the comparison example in FIG. 9 are given the same reference numerals.

A digitally modulated high frequency radio signal is received by the antenna 11 and input into the LNA 12. The LNA 12 amplifies the radio signal with low noise. The mixer 13 multiplies the output signal of the LNA 12 and a local signal from the oscillator 14 to perform frequency conversion, and generates a low frequency analog signal. The low pass filter 15 removes a high frequency component from the analog signal from the mixer 13. The output signal of the low pass filter 15 includes a DC offset generated mainly in the mixer 13.

The adder 16 adds the output signal of the low pass filter 15 and a correction voltage from the DAC 22, and outputs the addition result to the VGA 17. The VGA 17 amplifies the output signal of the adder 16. The gain of the VGA 17 is controlled by a VGA gain controller not shown in FIG. 1. The output signal of the VGA 17 includes a DC offset generated in the VGA 17. The ADC 18 AD-converts the output signal of the VGA 17. The AD-converted data is demodulated by a demodulator not shown in FIG. 1.

The output signal of the VGA 17 is input also into the comparator 19. The comparator 19 compares the output signal of the VGA 17 and a reference signal (ground potential). When the output signal of the VGA 17 is positive, the comparator 19 outputs a comparison result (comparator result) of a logical value "1", and when the output signal of the VGA 17 is negative, the comparator 19 outputs a comparison result of a logical value "0". The comparison result is input into the averaging circuit 20.

The averaging circuit 20 averages the comparison results. Specifically, the averaging circuit 20 obtains a signal Y (majority decision result) by performing majority decision on the logical values of the comparison results in a predetermined time period. More specifically, the averaging circuit 20 counts the number of times when the comparison result is "1" in a predetermined time period based on a clock. If the number of times when the comparison result is "1" is greater than or equal to a half of the number of the clocks, the averaging circuit 20 outputs the signal Y of "1". If the number of times when the comparison result is "1." is less than a half of the number of the clocks, the averaging circuit 20 outputs the signal Y of "0".

The SAR 21 sequentially sets each bit of a DAC code (first correction data) in order from the MSB, based on the signal Y of "1" or "0" input from the averaging circuit 20, so that a DC offset of the output signal of the VGA 17 decreases. A detailed operation of the SAR 21 will be described below.

The DAC 22 DA-converts the DAC code set by the SAR 21 and outputs the correction signal (first correction voltage) to the adder 16.

Figure 2:
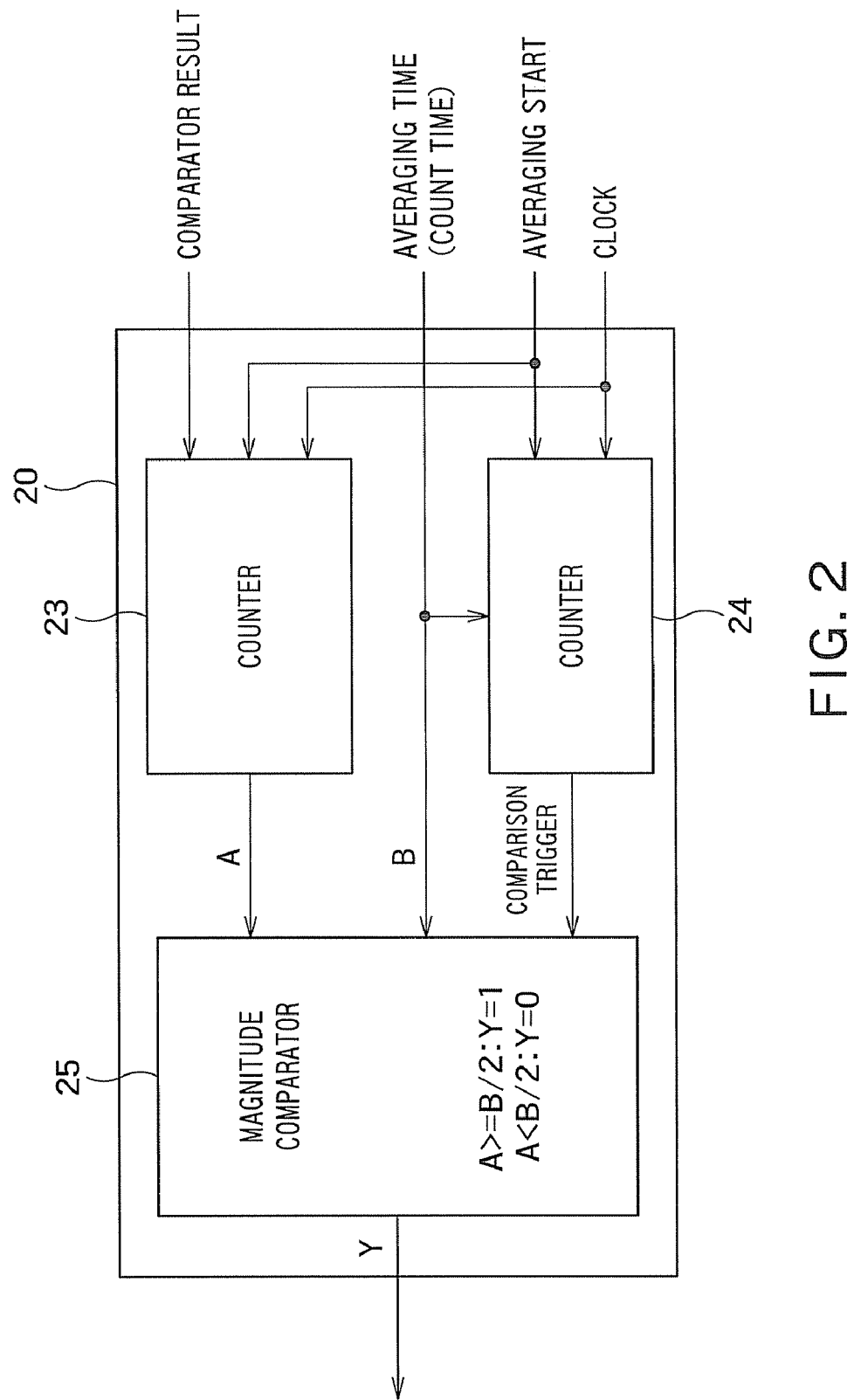
FIG. 2 is a block diagram of the averaging circuit according to the first embodiment of the present invention.

FIG. 2 is a block diagram of the averaging circuit according to the first embodiment of the present invention. As shown in FIG. 2, the averaging circuit 20 includes a first counter 23, a second counter 24, and a magnitude comparator 25.

The comparison result (comparator result) of the comparator 19, an averaging start signal from a control circuit not shown in the figures, and the clock are input into the first counter 23. When the averaging start signal is input into the first counter 23, the first counter 23 counts the number of the logical values "1" that are comparison results of the comparator 19 based on the clock, and outputs the number of counts A.

An averaging time B (count time: a predetermined number of clocks), the averaging start signal, and the clock are input into the second counter 24 from the control circuit not shown in the figures. When the averaging start signal is input into the second counter 24, the second counter 24 counts the number of clocks of the input clock. When the number of clocks counted by the second counter 24 reaches the averaging time B, the second counter 24 outputs a comparison trigger to the magnitude comparator 25.

At a timing when the comparison trigger is input, the magnitude comparator 25 outputs the signal Y of "1" if the number of counts A is greater than or equal to a half of the averaging time B, and the magnitude comparator 25 outputs the signal Y of "0" if the number of counts A is less than a half of the averaging time B.

Next, an operation of the SAR 21 and the averaging circuit 20 will be described with reference to a flowchart.

Figure 3:
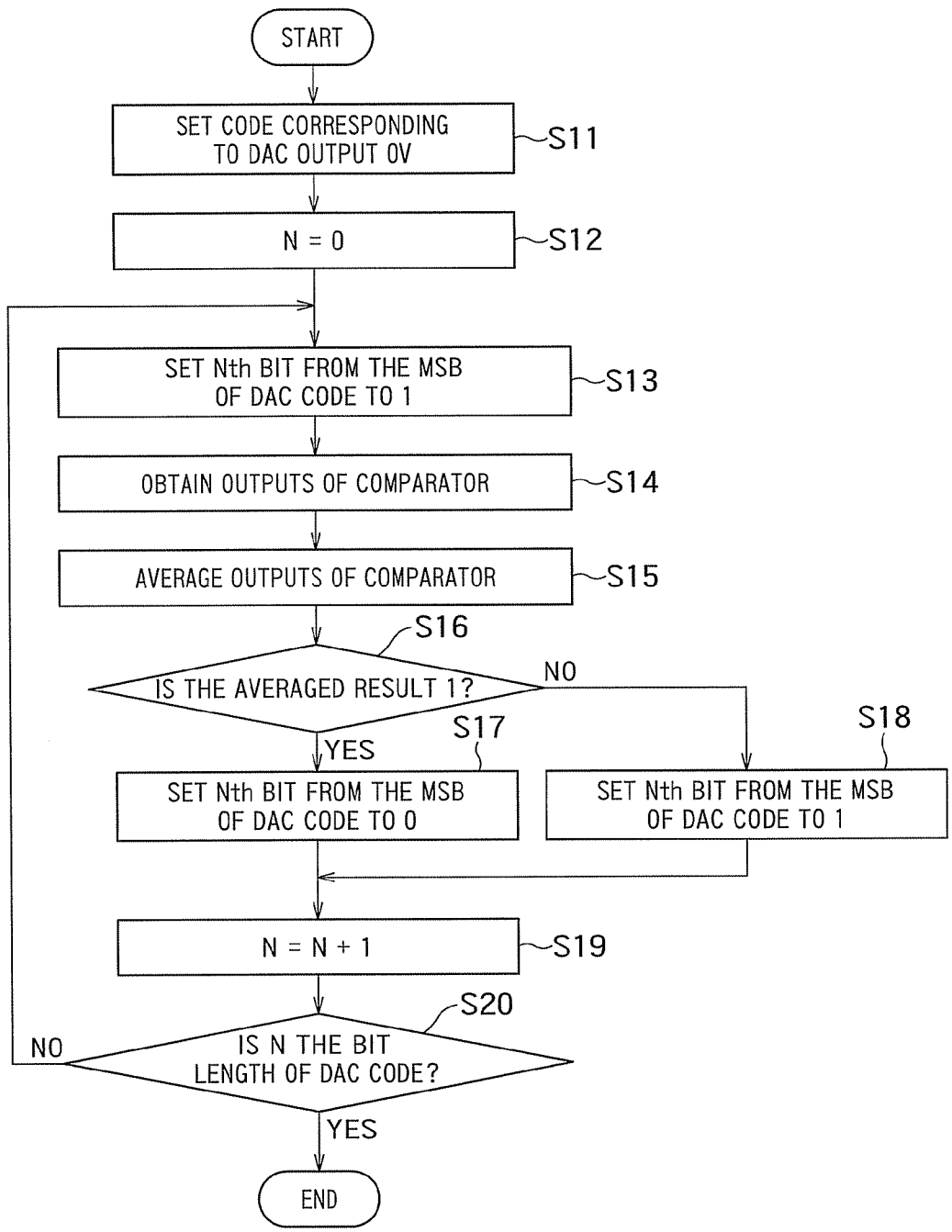
FIG. 3 is a flowchart showing an algorithm of the SAR including the averaging circuit according to the first embodiment of the present invention.

FIG. 3 is a flowchart showing an algorithm of the SAR including the averaging circuit according to the first embodiment of the present invention.

First, a DAC code corresponding to an output voltage 0 V of the DAC 22 is set (step S11).

Next, a variable N=0 is set (step S12).

Next, the Nth bit from the MSB of the DAC code is set to "1" (step S13).

Next, the outputs (comparison result) of the comparator 19 are obtained (step S14).

Next, the outputs of the comparator 19 are averaged (step S15). The averaging is performed as described above.

Next, it is determined whether the averaged result (signal Y) is "1" (step S16). If the averaged result is "1" (step S16: Yes), the Nth bit from the MSB of the DAC code is set to "0" (step S17). If the averaged result is "0" (step S16: No), the Nth bit from the MSB of the DAC code is set to "1" (step S18).

Next, the variable N=N+1 is set (step S19).

Next, it is determined whether the variable N is the bit length of the DAC code (step S20). When the variable N is the bit length of the DAC code (step S20: Yes), the process ends. When the variable N is not the bit length of the DAC code (step S20: No), the process returns to step S13.

The processing of steps S11 to S13 and steps S16 to S20 is performed by the SAR 21, and the processing of steps S14 and S15 is performed by the averaging circuit 20.

FIG. 4 is a table showing a correspondence relationship between the DAC code and the output voltage of the DAC according to the first embodiment of the present invention.

Here, an example in which the DAC code is 5 bits will be described. As described in FIG. 4, when the DAC code is "00000", the output voltage of the DAC 22 is −16 mV. Every time the DAC code is incremented, the output voltage of the DAC 22 is monotonically increased by 1 mV. When the DAC code is "10000", the output voltage of the DAC 22 is 0 V, and when the DAC code is "11111", the output voltage of the DAC 22 is 15 mV.

Next, an example of a process in which a DC offset is cancelled will be described with reference to the flowchart in FIG. 3 and the table in FIG. 4. Here, an example in which the DAC offset value of the output of the VGA 17 before cancellation is 10.5 mV will be described.

(1) First, a DAC code "10000" corresponding to an output voltage 0 V of the DAC 22 is set (step S11). A DC offset of 10.5 mV is output from the VGA 17.

Next, a variable N=0 is set (step S12).

Next, the 0th bit from the MSB of the DAC code is set to "1" (step S13). The DAC code is set to "10000". Since the output voltage of the DAC 22 is 0 V, a DC offset of 10.5 mV is output from the VGA 17.

Next, the outputs of the comparator 19 are obtained and averaged (steps S14 and S15). Even in a case in which the comparison results of the comparator 19 fluctuate between "1" and "0" due to the influence of noise, when the comparison results are averaged in the manner as described above, the averaged result is "1".

Since the averaged result is "1" (step S16: Yes), the 0th bit from the MSB of the DAC code is set to "0" (step S17). In this way, the DAC code is set to "00000".

The variable N=1 is set (step S19). Since the variable N is not the bit length of the DAC code (step S20: No), the process returns to step S13.

(2) The first bit from the MSB of the DAC code is set to "1" (step S13). The DAC code is set to "01000". Since the output voltage of the DAC 22 becomes −8 mV, a DC offset of 2.5 mV is output from the VGA 17.

Next, when the outputs of the comparator 19 are obtained and averaged, the averaged result is "1" (steps S14 and S15).

Since the averaged result is "1" (step S16: Yes), the first bit from the MSB of the DAC code is set to "0" (step S17). The DAC code is set to "00000".

The variable N=2 is set (step S19) and the process returns to step S13 (step S20: No).

(3) The second bit from the MSB of the DAC code is set to "1" (step S13). The DAC code is set to "00100". Since the output voltage of the DAC 22 becomes −12 mV, a DC offset of −1.5 mV is output from the VGA 17.

Next, when the outputs of the comparator 19 are obtained and averaged, the averaged result is "0" (steps S14 and S15).

Since the averaged result is "0" (step S16: No), the second bit from the MSB of the DAC code is set to "1" (step S18). The DAC code is set to "00100".

The variable N=3 is set (step S19) and the process returns to step S13 (step S20: No).

(4) The third bit from the MSB of the DAC code is set to "1" (step S13). The DAC code is set to "00110". Since the output voltage of the DAC 22 becomes −10 my, a DC offset of 0.5 mV is output from the VGA 17.

Next, when the outputs of the comparator 19 are obtained and averaged, the averaged result is "1" (steps S14 and S15).

Since the averaged result is "1" (step S16: Yes), the third bit from the MSB of the DAC code is set to "0" (step S17). The DAC code is set to "00100".

The variable N=4 is set (step S19) and the process returns to step S13 (step S20: No).

(5) The fourth bit from the MSB of the DAC code is set to "1" (step S13). The DAC code is set to "00101". Since the output voltage of the DAC 22 becomes −11 mV, a DC offset of −0.5 mV is output from the VGA 17.

Next, when the outputs of the comparator 19 are obtained and averaged, the averaged result is "0" (steps S14 and S15).

Since the averaged result is "0" (step S16: No), the fourth bit from the MSB of the DAC code is set to "1" (step S18). The DAC code is set to "00101".

The variable N=5 is set (step S19). Since the variable N is the bit length of the DAC code (step S20: Yes), the process ends.

By the above processing, "00101" is obtained as a final DAC code, and the output voltage of the DAC 22 becomes −11 mV. At this time, the DC offset value of the output of the VGA 17 is −0.5 mV, so that the DC offset value has decreased compared with the value of 10.5 mV before the DC offset cancellation is performed. The above DAC code is held in a register until the next DC offset cancellation is started, and the output voltage of the DAC 22 remains constant until then.

When the DC offset value is different from the value described above, the cancellation can be performed in a similar manner.

As described above, first, the polarity of the DC offset before the cancellation is determined by the comparator 19, and the polarity of the output voltage of the DAC 22 is determined. The determined polarity of the output voltage of the DAC 22 does not change until the next DC offset cancellation is started. In this state, the following processing is repeatedly performed for the number of times corresponding to the bit length of the DAC code: a determined positive or negative voltage is output from the DAC 22 by a certain absolute value, and the polarity of the obtained DC offset is determined. Each bit of the DAC code is sequentially set so that, if the polarity of the DC offset does not change from the previous polarity, a voltage whose absolute value is greater than that of the previous voltage is output from the DAC 22, and if the polarity of the DC offset changes from the previous polarity, a voltage whose absolute value is smaller than that of the previous voltage is output from the DAC 22.

For example, in the TDMA method, there are repetitive data along the time axis, in order of, burst transmission data, idle period, burst reception data, idle period. The idle period is a period in which there is no transmission/reception data. Therefore, the above-described DC offset cancellation can be performed in the idle period before the burst reception data.

As described above, according to this embodiment, the comparison results of the comparator 19 are averaged and averaged results are input into the SAR 21, so that even when the gain of the VGA 17 or the like is high, it is possible to reduce the influence of noise and correctly determine the polarity of DC offset. Therefore, regardless of the gain of the VGA 17 or the like, it is possible to reduce the influence of noise, correctly operate the DC offset canceller, and cancel the DC offset.

In addition, the DC offset canceller can be realized by only adding counters and the like to the circuit of the comparison example described above, so that increase of circuit scale is small.

Furthermore, according to this embodiment, the DC offset is effectively cancelled, and thus even when using a CMOS process which causes a DC offset larger than that of a bipolar process, it is possible to configure a receiving apparatus having a small DC offset. Therefore, according to this embodiment, it is possible to configure a receiving apparatus using a modulation method susceptible to the influence of DC offset by using a CMOS process. Such a modulation method includes, for example, OFDM (Orthogonal Frequency Division Multiplexing) or the like.

(Second Embodiment)

This embodiment is different from the first embodiment in points that the DC offset is cancelled based on a DC offset value estimated by averaging the output data of the ADC, and the DC offset is cancelled by passing the output data of the ADC through a high pass filter.

As described in the first embodiment, even when the DC offset cancellation is performed, a small DC offset, that can not be completely cancelled, may remain in the output signal of the VGA 17 due to a limitation of time in which the DC offset cancellation can be performed or the like. In addition, due to variation of the comparator 19, the polarity of DC offset may be erroneously determined, and a DC offset of the size corresponding to the variation may remain in the output signal of the VGA 17. In this embodiment, these DC offsets are also cancelled.

In the same manner as in the first embodiment, this embodiment will be described assuming that the DC offset cancellation is performed in the idle period before the burst reception data.

FIG. 5 is a block diagram of a receiving apparatus including a DC offset canceller according to a second embodiment of the present invention.

The receiving apparatus further includes a comparator variation correction adder (second adder) 31, a comparator variation correction DAC (second DA converter) 32, a high pass filter (hereinafter referred to as HPF) 33, a selector 34, and a demodulator 35 in addition to the configuration of the first embodiment shown in FIG. 1. The other configuration is the same as that of the first embodiment, so that the same reference numerals are given to the same constituent elements, and the description thereof will not be repeated.

The output signal of the VGA 17 is input into the comparator variation correction adder 31. The comparator variation correction adder 31 adds the output signal of the VGA 17 and a correction voltage (second correction voltage) output from the comparator variation correction DAC 32 and outputs the addition result to the ADC 18. The ADC 18 AD-converts the output signal of the comparator variation correction adder 31.

The HPF 33 is a digital filter. The output data of the ADC 18 is input into the HPF 33, and the HPF 33 attenuates the DC offset (direct current component) and outputs filtered data. The output data of the HPF 33 is input into one input terminal of the selector 34. The output data of the ADC 18 is also input into the other input terminal of the selector 34. The selector 34 outputs the output data of the HPF 33 or the output data of the ADC 18 to the demodulator 35 based on an HPF switching signal. The demodulator 35 demodulates the input data.

The demodulator 35 includes a VGA gain controller 36, an HPF switching controller 37, a DC offset estimation section 38, and a control section 39.

The VGA gain controller 36 controls the gain of the VGA 17 by a gain control signal, based on the strength of the reception signal. The VGA gain controller 36 outputs the gain of the VGA 17 (a control signal) to the HPF switching controller 37. The HPF switching controller 37 compares the gain of the VGA 17 with a predetermined threshold value. When the gain of the VGA 17 is higher than or equal to the threshold value (high gain), the HPF switching controller 37 outputs the HPF switching signal to the selector 34 so that the selector 34 outputs the output data of the HPF 33. When the gain of the VGA 17 is less than the threshold value (low gain), the HPF switching controller 37 outputs the HPF switching signal to the selector 34 so that the selector 34 outputs the output data of the ADC 18.

When the VGA gain controller 36 controls the gain of the VGA 17 to low gain, the DC offset estimation section 38 averages the output data of the ADC 18 (reception data) input into the demodulator 35 for a predetermined period of time and estimates a remaining DC offset value, and the DC offset estimation section 38 sets a comparator variation correction DAC code (second correction data: hereinafter also referred to as correction DAC code).

When the VGA gain controller 36 controls the gain of the VGA 17 to high gain, the DC offset estimation section 38 does not estimate the DC offset value and does not set the correction DAC code. However, the DC offset estimation section 38 holds a correction DAC code that was set previously. A detailed operation of the DC offset estimation section 38 will be described below.

The comparator variation correction DAC 32 converts the correction DAC code set by the DC offset estimation section 38 into the correction voltage and outputs the correction voltage to the comparator variation correction adder 31.

The control section 39 outputs an averaging time (count time), an averaging start signal, and a clock to the averaging circuit 20.

In the above configuration, when the gain of the VGA 17 is high, the DC offset cancellation is performed by using the SAR 21, the comparator variation correction DAC 32, and the HPF 33. When the gain of the VGA 17 is low, the DC offset cancellation is performed by using the SAR 21 and the comparator variation correction DAC 32. The reason why the HPF 33 is not used when the gain of the VGA 17 is low is to reduce power consumption.

Figure 6:
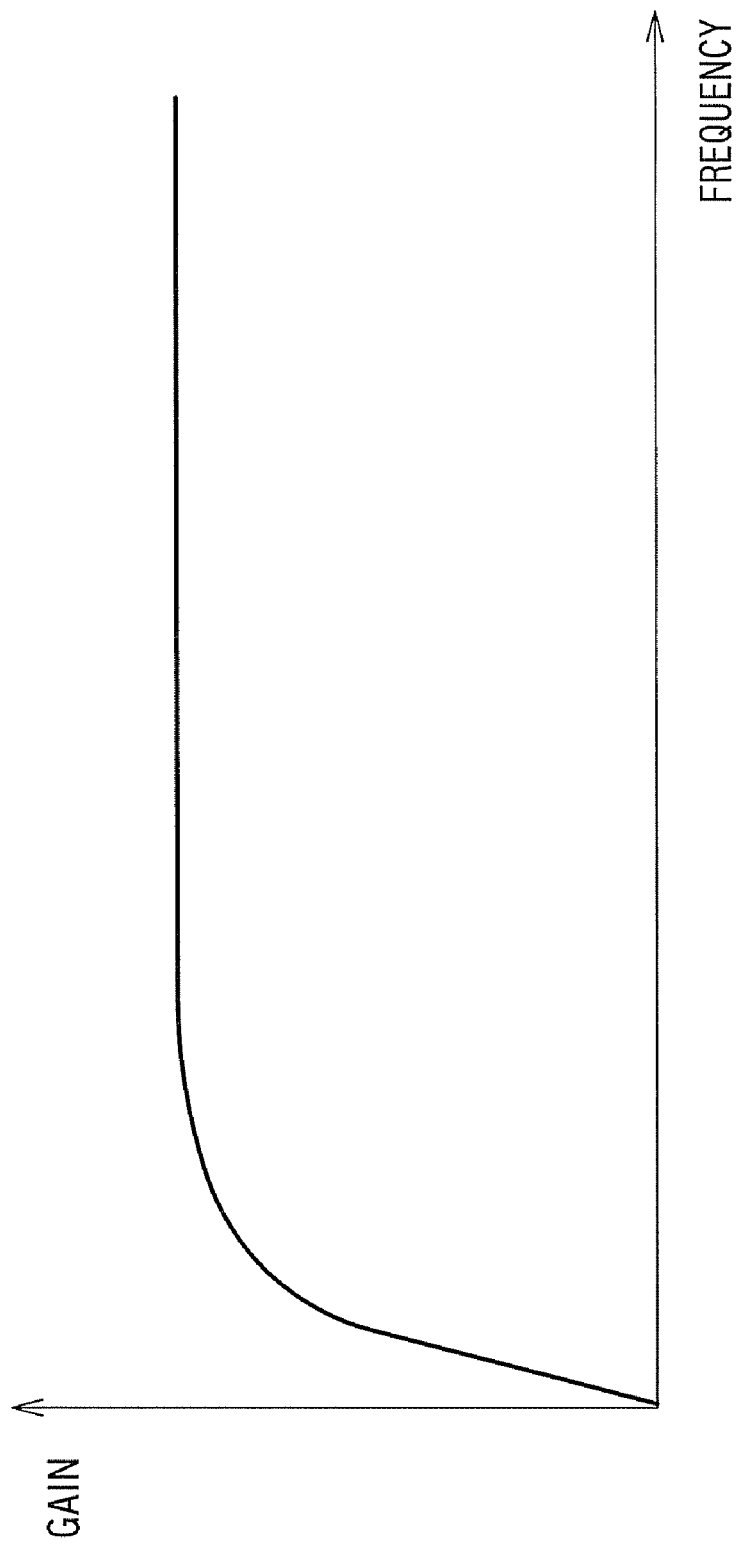
FIG. 6 is a frequency characteristic diagram of the HPF according to the second embodiment of the present invention.

FIG. 6 is a frequency characteristic diagram of the HPF according to the second embodiment of the present invention.

As shown in FIG. 6, the HPF 33 has a frequency characteristic that can attenuate a DC offset (direct current component). As described above, the HPF 33 removes the DC offset from the output data of the ADC 18 based on the characteristic.

Hereinafter, an operation of the DC offset cancellation will be described in more detail.

Figure 7:
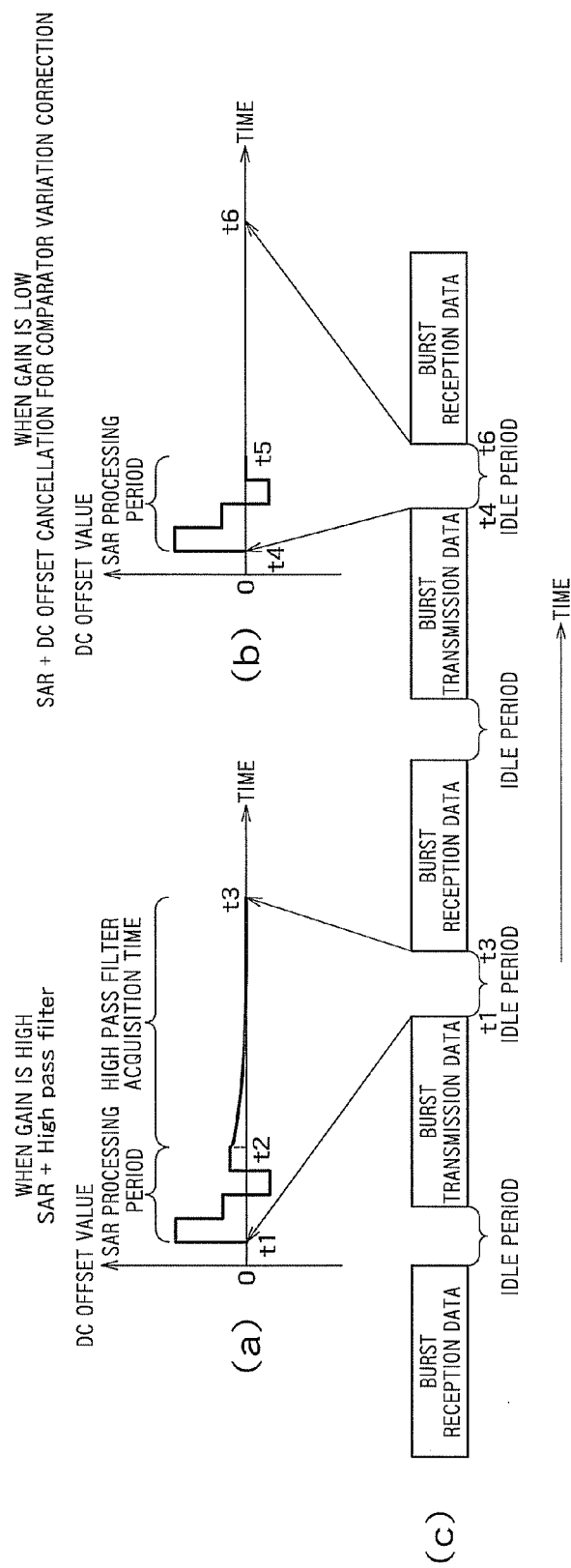
FIG. 7 is a diagram showing a process in which a DC offset is cancelled according to a second embodiment of the present invention.

FIG. 7(a) shows a relationship between a DC offset value and time when the gain is high. FIG. 7(b) shows a relationship between a DC offset value and time when the gain is low. These DC offset values are measured at the input of the demodulator 35. FIG. 7(c) shows a relationship between transmission/reception data and time.

FIG. 7(c) shows that the burst transmission data and the burst reception data repeatedly appear with the idle period therebetween along the time axis as described in the first embodiment. In the idle period, there is no transmission/reception data.

As described above, in this embodiment, the DC offset cancellation is performed in each idle period after the burst transmission data and before the burst reception data (periods from time t1 to t3 and from time t4 to t6). Each idle period is, for example, a period of about 50 μs.

Specifically, as shown in FIG. 7(a), if the gain of the VGA 17 is high, when the idle period after the burst transmission data starts (time t1), the DC offset cancellation by the SAR 21 of the first embodiment is performed, for example, for about 20 μs (time t1 to t2). Thereafter, it is waited, for example, for about 30 μs as an acquisition time of the HPF 33 until the DC offset of the output of the HPF 33 becomes small (time t2 to t3).

First, the DC offset can be sufficiently reduced by the SAR 21, so that the DC offset of the output of the HPF 33 can be further reduced without spending a long time even when the cutoff frequency of the HPF 33 is decreased (time constant is increased).

Since the comparator variation correction DAC 32 outputs the correction voltage based on the comparator variation correction DAC code set in the previous time of low gain, the DC offset is also cancelled by this correction voltage.

As shown in FIG. 7(b), when the gain of the VGA 17 is low, the DC offset cancellation by the SAR 21 is performed, for example, for about 20 μs (time t4 to t5). Thereafter, the comparator variation correction DAC code is newly set again, and the DC offset is cancelled (time t5). The comparator variation correction DAC code that is newly set will be described below.

Figure 8:
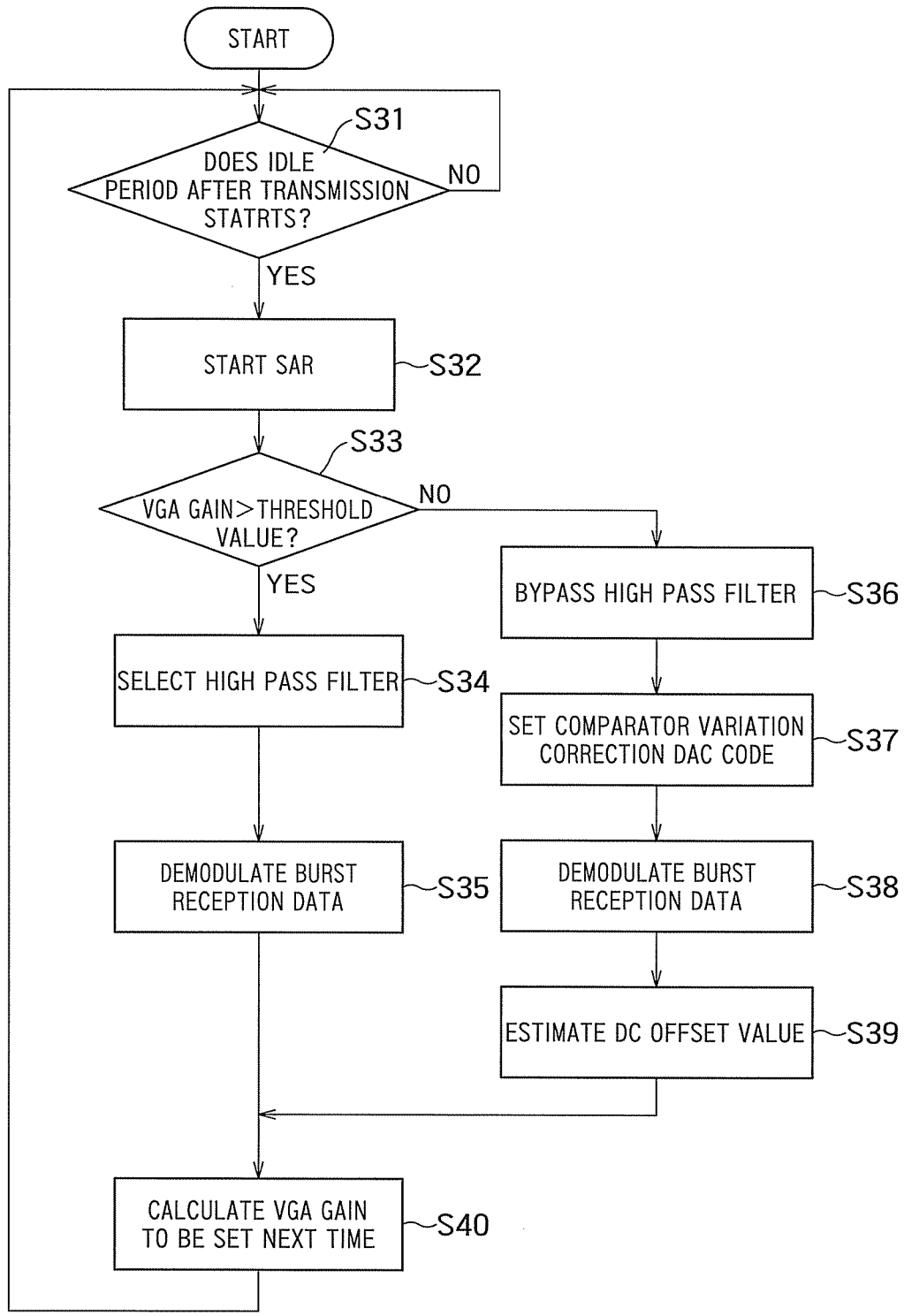
FIG. 8 is a flowchart showing an operation of the DC offset canceller according to the second embodiment of the present invention.

FIG. 8 is a flowchart showing an operation of the DC offset canceller according to the second embodiment of the present invention.

First, it is determined whether the idle period after the transmission starts (step S31). If the idle period does not start (step S31: No), the determination is performed again. If the idle period starts (step S31: Yes), the SAR 21 is started (step S32). In this way, as described in the first embodiment, the DC offset cancellation by the SAR algorithm in FIG. 2 is performed.

Next, it is determined whether the VGA gain is greater than or equal to the threshold value by the VGA gain controller 36 (step S33). If the VGA gain is greater than or equal to the threshold value (step S33: Yes), the HPF 33 is selected by the selector 34 (step S34). As described with reference to FIG. 7(a), the DC offset is reduced by the HPF 33 as time passes.

Next, when the idle period ends, while the DC offset is cancelled, the burst reception data (data from the time t3 in FIG. 7(c)) is demodulated by the demodulator 35 (step S35).

Next, the VGA gain to be set next time is calculated (step S40). This calculation is performed by the time when the idle period after the next transmission starts (time t4 in FIG. 7(c)).

Next, the process returns to step S31.

On the other hand, if the VGA gain is smaller than the threshold value (step S33: No), the HPF 33 is bypassed by the selector 34 (step S36), the comparator variation correction DAC code is set by the DC offset estimation section 38 (step S37). As described with reference to FIG. 7(b), the correction voltage is output by the comparator variation correction DAC 32 based on the set correction DAC code, and the DC offset is cancelled. The set correction DAC code is calculated by subtracting the correction DAC code corresponding to the DC offset value estimated in the previous time of low gain in step S39 described below from the correction DAC code set last. In this way, the DC offset value estimated in the previous time of low gain is cancelled.

Next, when the idle period ends, while the DC offset is cancelled, the burst reception data (data from the time t6 in FIG. 7(c)) is demodulated by the demodulator 35 (step S38).

Next, the burst reception data is averaged to estimate the DC offset value by the DC offset estimation section 38 (step S39). As described above, the DC offset value estimated at this time is used for setting the comparator variation correction DAC code (step S37) in the next idle period and the following idle periods when the gain is low.

Next, the VGA gain to be set next time is calculated (step S40). The processing of steps S39 and S40 are performed by the time when the idle period after the next transmission starts.

Next, the process returns to step S31.

By the processing of steps S34 and S37, the DC offset that cannot be completely cancelled in step S32 is cancelled.

The reason why the comparator variation correction DAC code is newly set and the DC offset value is estimated every time when the gain is low is because the DC offset value changes if the temperature changes. The reason why the DC offset value is not estimated when the gain is high is because the DC offset value may not be appropriately estimated due to the influence of amplified noise.

As described above, according to this embodiment, when the gain is low, the remaining DC offset value is estimated by averaging the output data of the ADC 18, so that the DC offset that cannot be completely cancelled by the SAR 21 can be cancelled based on the estimated DC offset value. When the gain is high, the output data of the ADC 18 is passed through the HPF 33, so that the DC offset that cannot be completely cancelled by the SAR 21 can be cancelled. Therefore, the DC offset can be cancelled more effectively than the first embodiment.

In addition, the same effects as those of the first embodiment can be obtained.

Although the embodiments of the present invention have been described in detail, specific configurations are not limited to the above embodiments, and various modifications may be implemented without departing from the scope of the present invention.

For example, the DAC code and the polarity of the output of the comparator 19 or the like is an example.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A DC offset canceller comprising:
a first DA converter configured to DA-convert first correction data into a first correction voltage;
a first adder configured to add an input signal and the first correction voltage to output a first added signal;
an amplifier configured to amplify the first added signal to output an amplified signal;
a comparator configured to compare the amplified signal and a reference voltage to output a comparison result;
an averaging circuit configured to receive the comparison results of the comparator to obtain a majority decision result by performing majority decision on logical values of the comparison results in a predetermined time period; and
a successive approximation register configured to sequentially set each bit of the first correction data based on the majority decision result so that a DC offset in the amplified signal decreases,
wherein the averaging circuit comprises
a first counter configured to count one logical value of the comparison results based on a clock,
a second counter configured to count the number of clocks of the clock, and
a magnitude comparator configured to, at a timing when the number of clocks reaches a predetermined number of clocks, if the number of counts of the one logical value is greater than or equal to a half of the predetermined number of clocks, output the one logical value of the comparison results as the majority decision result, and if the number of counts of the one logical value is less than a half of the predetermined number of clocks, output the other logical value of the comparison results as the majority decision result.

2. The DC offset canceller according to claim 1, further comprising:
an AD converter configured to AD-convert the amplified signal to output AD-converted data, the amplified signal being output from the amplifier, and
a filter configured to attenuate a direct current component of the AD-converted data.

3. The DC offset canceller according to claim 2, wherein the filter is a digital filter.

4. The DC offset canceller according to claim 2, wherein the filter is a high pass filter.

5. The DC offset canceller according to claim 2, wherein the amplifier is a variable gain amplifier that can change gain according to a gain control signal, and
the DC offset canceller further comprises
a selector configured to output either output data of the filter or the AD-converted data, based on a switching signal, and
a switching controller configured to output the switching signal so that the selector outputs the output data of the filter when the gain of the variable gain amplifier is greater than or equal to a predetermined threshold value, and the selector outputs the AD-converted data when the gain of the variable gain amplifier is less than the threshold value.

6. The DC offset canceller according to claim 1, wherein the amplifier is a variable gain amplifier that can change gain according to a gain control signal, and
the DC offset canceller further comprises
a second DA converter configured to convert second correction data into a second correction voltage,
a second adder configured to add the amplified signal and the second correction voltage to output a second added signal, the amplified signal being output from the variable gain amplifier;
an AD converter configured to AD-convert the second added signal to output AD-converted data, and
a DC offset estimation section configured to estimate a DC offset value by averaging the AD-converted data for a predetermined period of time, and configured to set the second correction data so that the estimated DC offset value is cancelled, when the gain of the variable gain amplifier is less than a predetermined threshold value.

7. The DC offset canceller according to claim 1, wherein the amplifier is a variable gain amplifier that can change gain according to a gain control signal, and
the DC offset canceller further comprises
a second DA converter configured to convert second correction data into a second correction voltage,
a second adder configured to add the amplified signal and the second correction voltage to output a second added signal, the amplified signal being output from the variable gain amplifier;
an AD converter configured to AD-convert the second added signal to output AD-converted data,
a filter configured to attenuate a direct current component of the AD-converted data,
a selector configured to output either output data of the filter or the AD-converted data, based on a switching signal,
a switching controller configured to output the switching signal so that the selector outputs the output data of the filter when the gain of the variable gain amplifier is greater than or equal to a predetermined threshold value, and the selector outputs the AD-converted data when the gain of the variable gain amplifier is less than the threshold value, and
a DC offset estimation section configured to estimate a DC offset value by averaging output data of the selector for a predetermined period of time, and configured to set the second correction data so that the estimated DC offset value is cancelled, when the gain of the variable gain amplifier is less than the threshold value.

8. A receiving apparatus comprising:
a low noise amplifier configured to amplify a radio signal received by an antenna to output an output signal;
an oscillator configured to generate a local signal;
a mixer configured to multiply the output signal of the low noise amplifier and the local signal to perform frequency conversion to generate an analog signal;
a low pass filter configured to remove a high frequency component from the analog signal;
a first DA converter configured to DA-convert first correction data into a first correction voltage;
a first adder configured to add an output signal of the low pass filter and the first correction voltage to output a first added signal;
an amplifier configured to amplify the first added signal to output an amplified signal;

a comparator configured to compare the amplified signal and a reference voltage to output a comparison result;

an averaging circuit configured to receive the comparison results of the comparator to obtain a majority decision result by performing majority decision on logical values of the comparison results, in a predetermined time period;

a successive approximation register configured to sequentially set each bit of the first correction data based on the majority decision result so that a DC offset in the amplified signal decreases;

an AD converter configured to AD-convert the amplified signal to output AD-converted data; and a demodulator configured to demodulate the AD-converted data, wherein the averaging circuit comprises a first counter configured to count one logical value of the comparison results based on a clock, a second counter configured to count the number of clocks of the clock, and a magnitude comparator configured to, at a timing when the number of clocks reaches a predetermined number of clocks, if the number of counts of the one logical value is greater than or equal to a half of the predetermined number of clocks, output the one logical value of the comparison results as the majority decision result, and if the number of counts of the one logical value is less than a half of the predetermined number of clocks, output the other logical value of the comparison results as the majority decision result.

9. The receiving apparatus according to claim 8, further comprising a filter configured to attenuate a direct current component of the AD-converted data to output filtered data to the demodulator.

10. The receiving apparatus according to claim 9, wherein the filter is a high pass filter.

11. The receiving apparatus according to claim 9, wherein the amplifier is a variable gain amplifier that can change gain according to a gain control signal, and the receiving apparatus further comprises a selector configured to output either output data of the filter or the AD-converted data to the demodulator, based on a switching signal, and a switching controller configured to output the switching signal so that the selector outputs the output data of the filter when the gain of the variable gain amplifier is greater than or equal to a predetermined threshold value, and the selector outputs the AD-converted data when the gain of the variable gain amplifier is less than the threshold value.

12. The receiving apparatus according to claim 8, wherein the amplifier is a variable gain amplifier that can change gain according to a gain control signal, and the receiving apparatus further comprises a second DA converter configured to convert second correction data into a second correction voltage, a second adder configured to add the amplified signal and the second correction voltage to output a second added signal to the AD converter, the amplified signal being output from the variable gain amplifier, and a DC offset estimation section configured to estimate a DC offset value by averaging the AD-converted data output from the AD converter for a predetermined period of time, and configured to set the second correction data so that the estimated DC offset value is cancelled, when the gain of the variable gain amplifier is less than a predetermined threshold value.

13. The receiving apparatus according to claim 8, wherein the amplifier is a variable gain amplifier that can change gain according to a gain control signal, and the receiving apparatus further comprises a second DA converter configured to convert second correction data into a second correction voltage, a second adder configured to add the amplified signal and the second correction voltage to output a second added signal to the AD converter, the amplified signal being output from the variable gain amplifier, a filter configured to attenuate a direct current component of the AD-converted data output from the AD converter, a selector configured to output either output data of the filter or the AD-converted data to the demodulator, based on a switching signal, a switching controller configured to output the switching signal so that the selector outputs the output data of the filter when the gain of the variable gain amplifier is greater than or equal to a predetermined threshold value, and the selector outputs the AD-converted data when the gain of the variable gain amplifier is less than the threshold value, and a DC offset estimation section configured to estimate a DC offset value by averaging output data of the selector for a predetermined period of time, and configured to set the second correction data so that the estimated DC offset value is cancelled, when the gain of the variable gain amplifier is less than the threshold value.

14. The receiving apparatus according to claim 8, the receiving apparatus being applicable to a wireless communication method comprising transmission data, a first idle period, reception data, and a second idle period along a time axis in this order, wherein the radio signal comprises the reception data.

15. The receiving apparatus according to claim 14, wherein the successive approximation register is configured to operate in the first idle period.

16. The receiving apparatus according to claim 13, the receiving apparatus being applicable to a wireless communication method comprising transmission data, a first idle period, reception data, and a second idle period along a time axis in this order, wherein the radio signal comprises the reception data, the successive approximation register is configured to operate in the first idle period, the switching controller is configured to output the switching signal in the first idle period after an operation of the successive approximation register ends, and the DC offset estimation section is configured to set the second correction data, based on the DC offset value estimated in advance, in the first idle period after the switching controller outputs the switching signal, and configured to estimate the DC offset value used for setting the second correction data next time, based on the reception data, after the first idle period.

17. The receiving apparatus according to claim 8, wherein the low noise amplifier, the oscillator, the mixer, the low pass filter, the first AD converter, the first adder, the amplifier, the comparator, the averaging circuit, the successive approximation register, the AD converter, and the demodulator are configured by using a CMOS process.

18. A DC offset cancellation method comprising:

DA-converting first correction data into a first correction voltage by a first DA converter;

adding an input signal and the first correction voltage to output a first added signal by a first adder;

amplifying the first added signal to output an amplified signal by an amplifier;

comparing the amplified signal and a reference voltage to output a comparison result by a comparator;

receiving the comparison results of the comparator to obtain a majority decision result by performing majority decision on logical values of the comparison results in a predetermined time period, by an averaging circuit; and sequentially setting each bit of the first correction data based on the majority decision result so that a DC offset in the amplified signal decreases, by a successive approximation register, wherein the receiving the comparison results of the comparator to obtain the majority decision result, by the averaging circuit, comprises counting one logical value of the comparison results based on a clock, by a first counter, counting the number of clocks of the clock, by a second counter, and at a timing when the number of clocks reaches a predetermined number of clocks, if the number of counts of the one logical value is greater than or equal to a half of the predetermined number of clocks, outputting the one logical value of the comparison results as the majority decision result, and if the number of counts of the one logical value is less than a half of the predetermined number of clocks, outputting the other logical value of the comparison results as the majority decision result, by a magnitude comparator.

* * * * *